United States Patent [19]

Park

[11] Patent Number: 5,832,037

[45] Date of Patent: Nov. 3, 1998

[54] METHOD OF COMPRESSING AND EXPANDING DATA

[75] Inventor: In-chul Park, Suwon, Rep. of Korea

[73] Assignee: SamSung Electronics Co., Ltd., Suwon, Rep. of Korea

[21] Appl. No.: 669,704

[22] Filed: Jun. 24, 1996

[30] Foreign Application Priority Data

Jun. 23, 1995 [KR] Rep. of Korea .................. 17152/1995

[51] Int. Cl.$^6$ .................................................. H04B 1/66
[52] U.S. Cl. ........................... 375/240; 375/240; 341/50; 341/51; 341/86
[58] Field of Search .............................. 375/240; 341/50, 341/51, 86; 382/232, 231, 244; 348/384

[56] References Cited

U.S. PATENT DOCUMENTS

| | | | |
|---|---|---|---|
| 5,293,379 | 3/1994 | Carr | 370/94.1 |
| 5,432,891 | 7/1995 | Onodera | 395/114 |
| 5,521,940 | 5/1996 | Lane et al. | 375/240 |
| 5,561,688 | 10/1996 | Jones, Jr. | 375/240 |

*Primary Examiner*—Stephen Chin
*Assistant Examiner*—Michael W. Maddox
*Attorney, Agent, or Firm*—Robert E. Bushnell, Esq.

[57] ABSTRACT

A data compression method and apparatus therefor effects the steps of (a) obtaining an N-bit information word from a bit stream; (b) compressing the N-bit information word into an X-bit information word where X is less than N; (c) obtaining an (N–X)-bit information word from the bit stream; (d) producing a new N-bit information word using the compressed X-bit information word and the (N–X)-bit information word, and (e) repeatedly performing steps (b) through (d) if the new N-bit information word is compressible and otherwise repeatedly performing steps (a) through (d). A data expanding method and apparatus effects includes the steps of: (a) obtaining an (N–X)-bit information word from an N-bit information word, (b) expanding the remaining X-bit information word into an N-bit information word, excluding the (N–X)-bit information word, and (c) repeatedly performing steps (a) and (b) until an N-bit information word is restored. Thus, a bit stream word can be compressed to a fixed length of N bits without loss, and then subsequently expanded.

20 Claims, 3 Drawing Sheets

METHOD OF COMPRESSING AND EXPANDING DATA

CROSS REFERENCE TO RELATED APPLICATIONS

This application make reference to, incorporates the same herein, and claims all benefits accruing under 35 U.S.C §119 from an application entitled METHOD OF COMPRESSING AND EXPANDING DATA earlier filed in the Korean Industrial Property Office on 23 Jun., 1995 and there duly assigned Serial No. 1995/17152.

BACKGROUND OF THE INVENTION

1. Field of the Invention

The present invention relates to a method and apparatus for compressing and expanding data, and more particularly, to apparatus and processes for executing a lossless data compression and expansion by repetitive iterations.

2. Background Art

The rapid increase in the quantity of information to be processed in recent times has necessitated more and more data storage capacity, but hardware technologies have not kept pace with demand in this field. Therefore, the storage capacity of a recording medium has been effectively increased through the use of data compression methods, which can be roughly divided into "lossless" data compression by which all of the information contained within the compressed data can be restored (i.e., expanded) and "lossy" data compression by which a portion of the compressed data is lost upon restoration. Though the latter method, at 100:1, has a better compression ratio than the former method which has a compression ratio of only about 3:1, it can not perfectly restore all of the information at the time of restoration, and thus is mainly used when a great deal of redundancy is present, e.g., for picture information.

SUMMARY OF THE INVENTION

Therefore, it is an object of the present invention to provide an improved process and apparatus for compressing and expanding data.

It is another object to provide processes and apparatus to provide lossless data compression and expansion process and apparatus having a good data compression ratio, by repeatedly performing a data compression step and a new information input step.

To accomplish the above object, there is provided a data compression apparatus and process for compressing data contained within a bit stream by obtaining an N-bit information word from the bit stream; compressing the N-bit information word into an X-bit information word where X is less than N; obtaining an (N–X)-bit information word from the bit stream; producing a new N-bit information word using the compressed X-bit information word and the (N–X)-bit information word; and repeatedly performing the steps compressing the N-bit information word, obtaining the (N–X)-bit information word from the bit stream, and producing the new N-bit information word using the compressed X-bit information word and the (N–X)-bit information word when the new N-bit information word is compressible, and otherwise, repeatedly performing the steps obtaining the N-bit information word from the bit stream, repeatedly performing the steps compressing the N-bit information word, obtaining the (N–X)-bit information word from the bit stream, and producing the new N-bit information word using the compressed X-bit information word and the (N–X)-bit information word.

There is also provided a data expanding apparatus and operational process for expanding compressed data contained within a bitstream, by obtaining an (N–X)-bit information word from an N-bit information word in the bitstream; expanding the remaining X-bit information word into an N-bit information word, while excluding the (N–X)-bit information word; and repeatedly performing the steps of obtaining an (N–X)-bit information word from an N-bit information word in the bitstream, and expanding the remaining X-bit information word into an N-bit information word, while excluding the (N–X)-bit information word until the original N-bit information word is restored.

According to the principles of the present invention, a bit stream can be compressed into an N-bit information word having a fixed length without loss, by repeatedly performing the steps of compressing an N-bit information word into an X-bit information word where X is less than N and forming a new N-bit information word by obtaining an (N–X)-bit information word from the bit stream. The compressed data can then be expanded by reversely performing the steps of the compression method.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
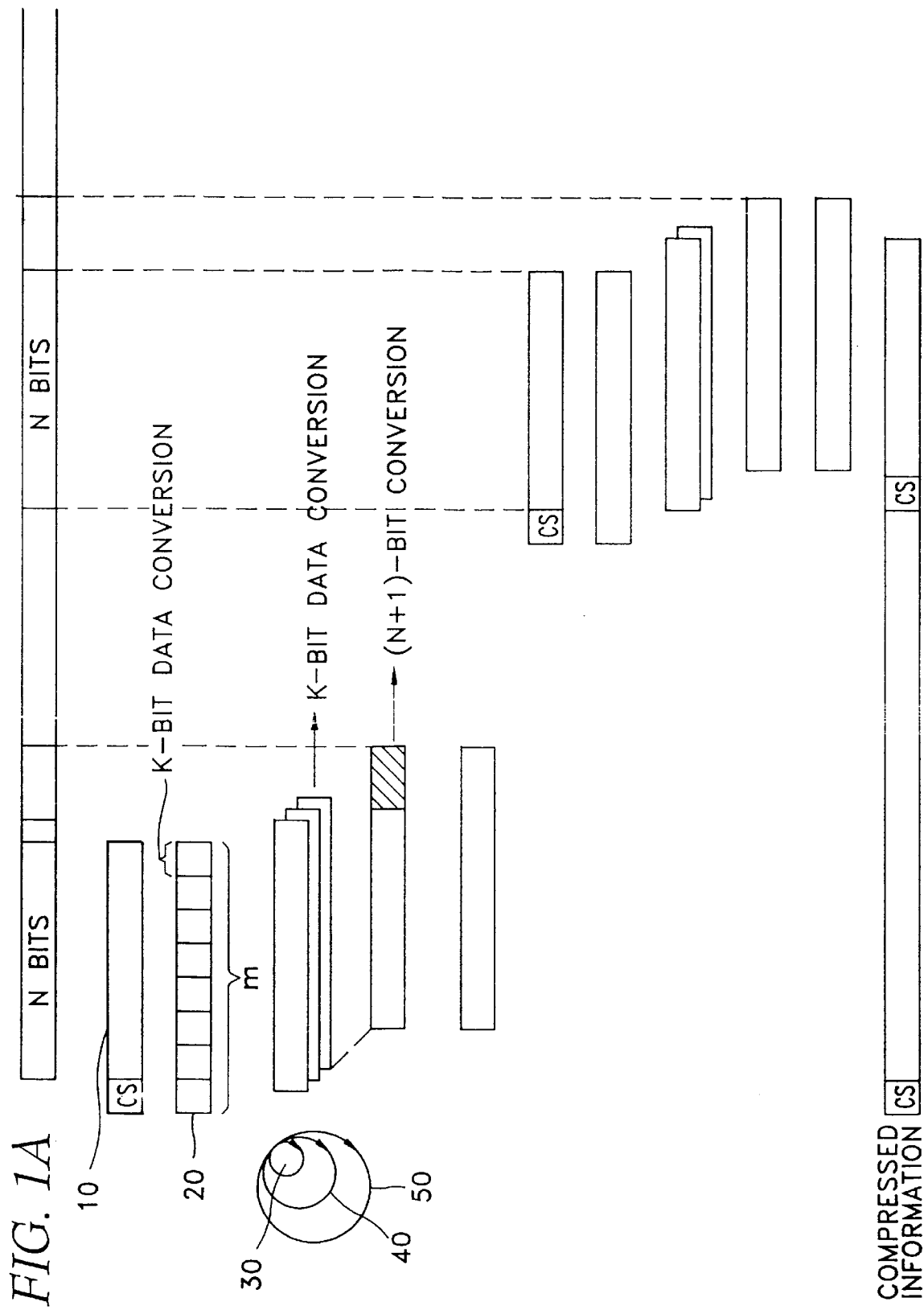
FIG. 1A is a diagram for explaining principles of data compression practiced according to the present invention.
Figure 1B:
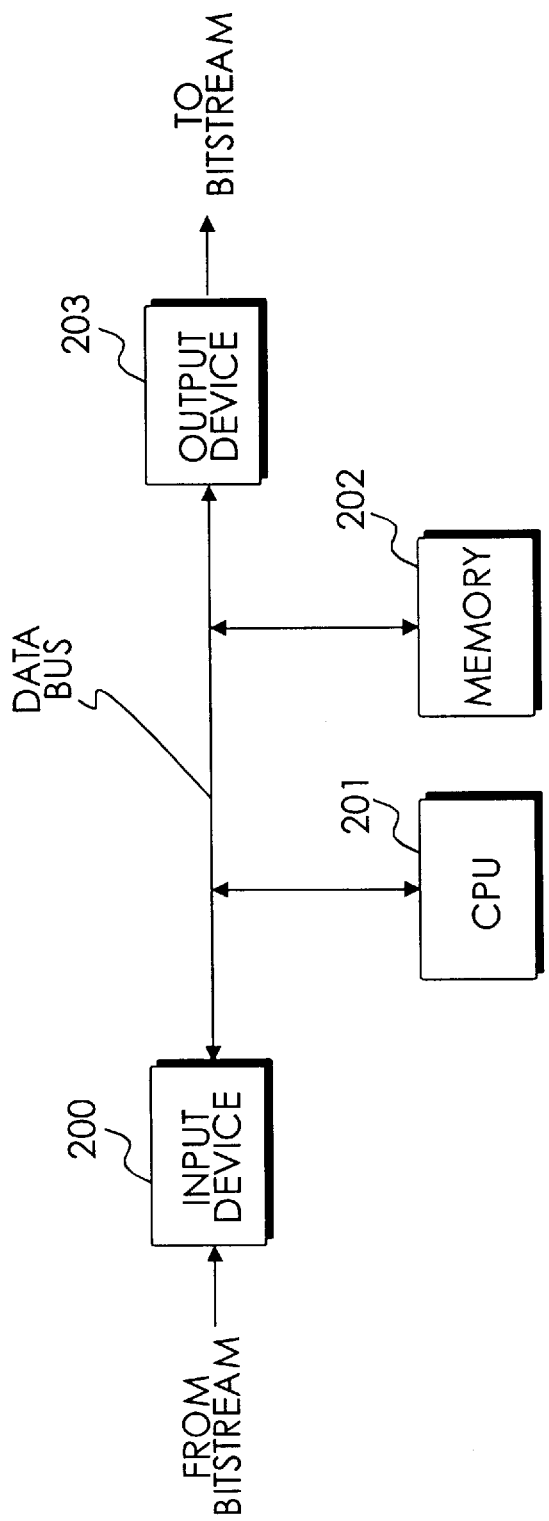
FIG. 1B is a block diagram of an apparatus for data compression and expansion according to the principles of the present invention.

Turning first to FIG. 1B, a block diagram illustrates an apparatus constructed to perform data compression and expansion according to the principles of the present invention. An input device 200, receives data information words from a bitstream and transmits them to a central processing unit CPU 201 through a data bus. The CPU performs operations on the data from the input device 200 utilizing a memory 202 and outputs the compressed data or the expanded data stored in the memory 202 via the data bus and an output device 203.

While all of the various operations performed on the data as noted below are performed in the CPU 201, it is understood to one skilled in the art that other hardwired components may be utilized to perform the operations on the data as noted below.

Data compression according to the present invention contemplates (a) obtaining an N-bit information word from a bit stream; (b) compressing the N-bit information word into an X-bit information word where an X is less than N; (c) obtaining an (N–X)-bit information word from the bit stream; (d) producing a new N-bit information word from the compressed X-bit information word and the (N–X)-bit information word; and (e) repeatedly performing the steps (b) through (d).

The compression performed by step (b) includes (a') dividing N+1 bits including the N-bit information word and 1-bit start information into m data words (m being an integer greater than one) of k bits, (b') checking whether there is a difference value smaller than a preset threshold value D among m-1 difference values of the m data words and if present, converting one of two data values, whose difference is smaller than the preset threshold value D, into a k-bit information including 1-bit start information, T-bit flag compression step information, e-bit state conversion information, 1-bit new information, a-bit sequence information of two data values, and (k-T-2-2a-e)-bit difference value information, (c') inputting 1-bit of new information and repeatedly performing the converting step until there is no difference value smaller than D among m-1 difference values of m data words with respect to m data words processed by the converting step, and (d') repeatedly performing the steps (a') through (c') if a difference value smaller than D is no longer present among m-1 difference values of m data. Here, k is greater than or equal to 2a+T+e+2 and D equals $2^{k-T-2-2a-e}-1$. It is preferable that the converted data is positioned in a first position of the m data word in step (b').

In more detail, referring to FIG. 1A, a data compression method according to the present invention is performed by (1) obtaining an (N-1)-bit information word (where N=km) from a bit stream (step 10), (2) dividing N bits composed of an (N-1)-bit information word and 1-bit of start information into m data words (m being an integer greater than one) each of k bits (step 20), (3) checking whether there is a difference value smaller than a preset threshold value D among m-1 difference values of m data words, and if present, converting one of two data values into a k-bit information word including 1-bit start information, T-bit flag compression step information, e-bit state conversion information, 1-bit new information, a-bit sequence information of said two data values, and (k-T-2-2a-e)-bit difference value information, (4) inputting 1-bit new information and repeatedly performing the converting step until there is no difference value smaller than D among m-1 difference values of m data words (step 30), (5) in step (3), if no such value is present, rearranging m data words according to the magnitude of the difference values, and sequentially storing original sequence information word of the rearranged m data words in the order of rearranged data, (6) subtracting preset values $D_i$ from the rearranged data values excluding the first data value, where $1 \leq i \leq m-1$, (7) obtaining the remaining number of bits r obtained by subtracting the start information bit number (e.g., 1), m·a, the compression step information bit number (e.g., T), the new information bit number (e.g., 1), and the state conversion information bit number (e.g., e) from N; obtaining a quotient q by dividing r by m, checking whether r is smaller than b given that b=k+q(m-1)+f, where f is the number of flag bits during compression, converting the N bits into bits of start information, compression step information, new information, state conversion information, sequence information, sub-step information, first sorted data, q(m-1)-bit difference values of subtraction-operated data equal to q bits or less, and the remaining bits of the N bits, if r is greater than or equal to b and all difference values are to q bits or less, and converting the N bits into start information, compression step information, new information, state conversion information, sequence information, sub-step information, first sorted data, display information (k+(logm/log2)bits) of one of said subtraction-operated data equal to q bits or more, [(q-1)(m-2)]-bit difference values of remaining subtraction-operated data equal to q-1 bits or less, and the remaining bits of the N bits, if r is greater than or equal to b, only one difference value is q bits or more and the remaining values are to q-1 bits or less, and converting the N bits into start information, compression step information, new information, state conversion information, sequence information, sub-step information, a first sorted data, [(q-1)(m-1)]-bit difference values of subtraction-operated data equal to q-1 bits or less, and remaining bits among N bits, if r is less than b, q is set to q-1 and all difference values are q-1 bits or less, and converting the N bits into start information, compression step information, new information, state conversion information, sequence information, sub-step information, first sorted data, display information (K+(logm/log2)bits) of one of subtraction-operated data equal to q-1 bits or more, [(q-2)(m-2)]-bit difference values of the remaining subtraction-operated data equal to q-2 bits or less, and remaining bits among N bits, if r is less than b, one difference value is q-1 bits or more and all remaining difference values are q-2 bits or less, and (8) repeatedly performing all the above steps (1) through (7) with respect to an N-bit stream (step 40).

Here, $k \geq 2a+T+e+2$ and k is a positive integer where r exists, and $D=2^{K-T-2-2a-e}-1$.

Here, if the case is not applicable to those mentioned above, predetermined state variables for each data value are operated and then the aforementioned processes are repeatedly performed with respect to operated data (step 50).

If data is not further compressed despite state conversions using all state variables, another compression is performed in the same way as mentioned above by obtaining a new N-bit information word.

Figure 2:
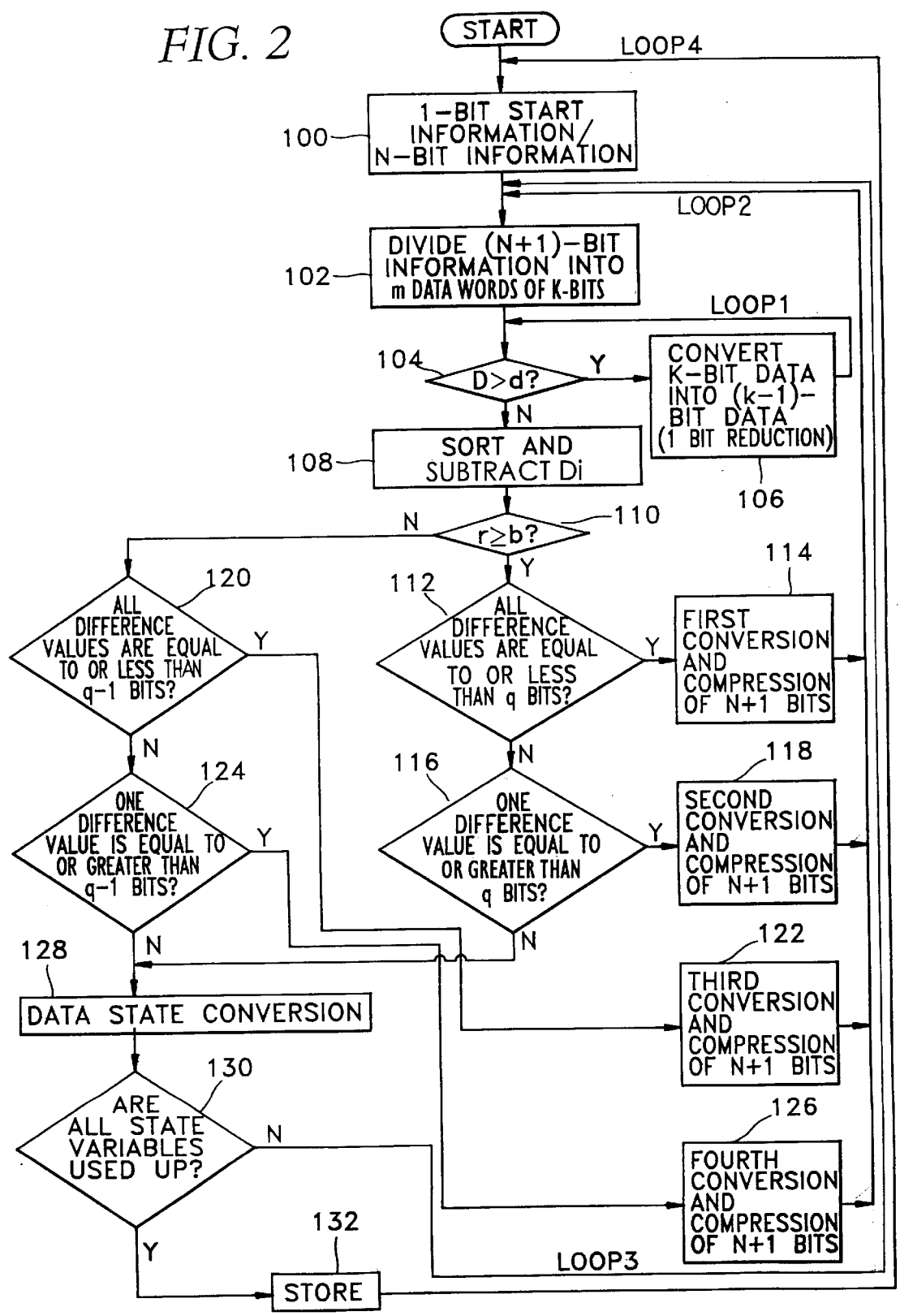
FIG. 2 is a flowchart illustrating data compression according to the principles of the present invention.

Referring now to FIG. 2, an N-bit information word is first obtained from the bitstream and then an (N+1)-bit information word is obtained by adding 1-bit of start information to the N bits (step 100). The (N+1)-bit information word is divided into m data words of k bits (step 102). After determining whether there is a value smaller than a threshold difference value D among difference values d of divided data, if present, one of two data values is converted into k-1 bits and 1-bit of new information is added thereto, to form k-bit new data (step 106). Step 104 is performed to determine a difference value between new data and remaining data. Thus, whenever one circuit of a loop 1 is completed, compression is effected by one bit and 1-bit of new information is obtained to form an (N+1)-bit new information word.

If there is no value smaller than D in step 104, data is sorted into the order of magnitude, data sequence information coming before assortment is obtained, and then a preset value $D_i$ is subtracted from each data value (step 108).

m·a, the start information bit number (e.g., 1), the compression step information bit number (e.g., T), the new information bit number (e.g., 1), and the state conversion information bit number (eg., e) are subtracted from N bits, to obtain the number of remaining bits r. The r value is divided by m to obtain a quotient (q). Then, a determination is made as to whether r is smaller than b, given that b=k+q(m-1)+f, where f is the number of flag bits during compression (step 110).

If r is greater than or equal to b and all difference values and equal to or less than q bits or less (step 112), then the N bits are converted into start information, compression step information, new information, state conversion information, sequence information, sub-step information, first sorted data, [q(m-1)]-bit difference values of subtraction-operated data equal to q bits or less, and remaining bits among N bits (step 114).

Also, should r be greater than or equal to b, and only one difference value equal to or greater than q bits or more and the remaining difference values equal to (q−1) bits or less (step 116), then the N bits are converted into start information, compression step information, new information, state conversion information, sequence information, sub-step information, first sorted data, display information (k+(logm/log2)bits) of one of a subtraction-operated data word equal to q bits or more, [(q−1)(m−1)]-bit difference values of the remaining subtraction-operated data equal to q−1 bits or less, and remaining bits among N bits (step 118).

If r is less than b in step 110, q is set to (q−1) and all difference values are equal to or less than (q−1) bits or less (step 120), then the N bits are converted into start information, compression step information, new information, state conversion information, [(q−1)(m−1)]-bit difference values of subtraction-operated data equal to (q−1) bits or less, and remaining bits among N bits (step 122).

If r is less than b in step 110, and one difference value equal to (q−1) bits or more and the remaining difference values equal to (q−2) bits or less (step 124), then the N bits are converted into start information, compression step information, new information, state conversion information, sequence information, sub-step information, a sorted first data, [k+(logm/log2)]-bit display information of subtraction-operated data equal to (q−1) bits or more, [(q−2)(m−2)]-bit difference values of remaining subtraction-operated data equal to (q−2) bits or less, and remaining bits among N bits (step 126). Thus, the process of loop 2 is completed. If the case is not applicable to those of the above-mentioned loop 2, a loop 3 is performed such that data is state-converted by finding compressible states while changing difference values by a summation, subtraction or XOR (Exclusive-ORing) operation according to state conversion information (step 128). If data is not further compressed with all state variables used up in step 128 (step 130), compressed (N+1)-bit information is stored (step 132) and step 100 is performed again in order to obtain new N-bit information, thereby forming a loop 4.

The aforementioned data compression method according to the present invention will become more apparent by describing in detail preferred embodiments thereof.

EMBODIMENT 1

First, assuming that CS is 1-bit start information, N is 127 (the number of bits of input information), k is 16 (the number of bits of divided data), m is 8 (the number of divisions), CT is T-bit compression step flag information (T is the number of bits of CT, e.g., 1), CV is 1-bit save information, $CA_i$ is a-bit data sequence information (a is the number of bits of $CA_i$, e.g., 3, and that $0 \leq i \leq 7$), CE is e-bit state conversion information (e is the number of bits of CE, e.g., 3), and a threshold difference value D is 15 ($2^{k-T-2-2a-e}-1=2^4-1$).

In the first step, a 128-bit word is obtained from the bitstream by a start bit (e.g., "1") and 127-bit information word 000,0011,0110,0110, 0110,0110,0110,0010, 0111, 1100,0111,1101, 1000,1001,0110,0011, 0110,0110,0110, 1010, 0111,0001,1101,1111, 0111,0100,1010,1111, 0110, 1011,0101,1100 and is divided into eight 16-bit data values, as indicated in Table 1.

TABLE 1

| 0 | 1 | 2 | 3 | 4 | 5 | 6 | 7 |
|---|---|---|---|---|---|---|---|
| 8366h | 6662h | 7C7Dh | 8963h | 666Ah | 71DFh | 74AFh | 6B5Ch |

In the second step, a difference value (d) is obtained for adjacent data values and it is determined whether there is a difference value smaller than a threshold difference value D. In this case, since the second data value 6662h is smaller than the fifth data value 666Ah by 8, there will be one difference value (d) smaller than 15 (D).

Using the CS, CT, CV, CE, $CA_2$, $CA_5$ and d values (0, 1, X, 000, 001, 100 and 1000, respectively), the fifth data 666Ah is converted into 01X 000 001 100 1000, (Here, X represents a "don't care" bit).

Thus, when "1" is newly added to new save bit X, the converted data is expressed as 0110,0000,1100,1000 (60C8h). The converted data is put in a first position, so that Table 1 is rearranged to obtain the following Table 2.

TABLE 2

| 0 | 1 | 2 | 3 | 4 | 5 | 6 | 7 |
|---|---|---|---|---|---|---|---|
| 60C8h | 8366h | 6662h | 7C7Dh | 8963h | 71DFh | 74AFh | 6B5Ch |

Therefore, 128-bit data is compressed into 127-bit data, by 1 bit, through data conversion. Then, 128-bit data is newly formed by adding a new 1 bit.

In the third step, it is determined whether there is a difference value smaller than D with respect to eight data values in Table 2. Since there is no difference value smaller than D, the data is rearranged in an ascending series to obtain Table 3.

TABLE 3

| 0(0) | 1(2) | 2(7) | 3(5) | 4(6) | 5(3) | 6(1) | 7(4) |
|---|---|---|---|---|---|---|---|
| 60C8h | 6662h | 6B5Ch | 71DFh | 74AFh | 7C7Dh | 8366h | 8963h |

Original position information (Table 2) is arranged in the order of the rearranged data (Table 3) and results in the sequence 000-010-111-101-110-011-001-100.

Since every difference value between a pair of adjacent data values is greater than or equal to a threshold difference value (e.g., 15), preset values $D_i$ (where $0<i<8$) are subtracted from each data value to obtain Table 4.

TABLE 4

| 0(0) | 1(2) | 2(7) | 3(5) | 4(6) | 5(3) | 6(1) | 7(4) |
|---|---|---|---|---|---|---|---|
| 60C8h | 6653h | 6B3Eh | 71B2h | 7473h | 7C32h | 830Ch | 88FAh |
| Δ: | ⌊58B⌋ | ⌊4EB⌋ | ⌊674⌋ | ⌊2C1⌋ | ⌊7BF⌋ | ⌊6DA⌋ | ⌊5EE⌋ |

Original position information bit number (e.g., 24), start information bit number (e.g., 1), step information bit number (e.g., 1), save information bit number (e.g., 1), and state conversion information bit number (e.g., 3) are subtracted from 128 to leave 98 (r) so that the quotient q is 12 (98 divided by m). In the case of a 2-bit sub-step flag (f) however, if all difference values among the data are 12 bits or less, b is obtained using the equation:

$$b=k+q(m-1)+f$$

(e.g., b=16+(12×7)+2) and equals 102, which exceeds 98. Thus, it is impossible to amount to difference values as q bits. When all difference values among the data are to 11 bits or less, b is 95 (16+(11×7)+2) and the number of bits is reduced by three, and when a 1-bit save bit is included, the effective compression is by four bits. Accordingly, the original data is expressed in the form of difference values, e.g., 00W$_1$, 000, 000-010-111-101-110-011-001-100, 00, 60C8h, 7d$_i$, W$_2$W$_3$W$_4$. Here, W$_1$W$_2$W$_3$W$_4$ indicate four bits of newly input information.

If W$_1$W$_2$W$_3$W$_4$ is 1010, a newly prepared 128-bit information word is 0,0,1, 000, 000-010-111-101-110-011-001-100, 00, 0110,0000,1100,1000, 101,1000,1011, 100,1110, 1011, 110,0111,0100, 001,1100,0001, 111,1011,1111, 110, 1101,1010, 101,1110,1110, 010. This is divided into 16-bit data and arranged as 0010,0000,0010,1111, 0111,0011,0011, 0000, 0110,0000,1100,1000, 1011,0001,0111,0011, 1010, 1111,0011,1010, 0001,1100,0001,1111, 0111,1111,1011, 0110, 1010,1111,0111,0010, hexadecimally expressed in Table 5.

TABLE 5

| 0 | 1 | 2 | 3 | 4 | 5 | 6 | 7 |
|---|---|---|---|---|---|---|---|
| 202Fh | 7330h | 60C8h | B173h | AF3Ah | 2C1Fh | 7FB6h | AF72h |

The data values of Table 5 are rearranged in the order of their magnitude and difference values between each are obtained, as indicated in the following Table 6.

TABLE 6

| 0 | 1(5) | 2 | 3(1) | 4(6) | 5(4) | 6(7) | 7(3) |
|---|---|---|---|---|---|---|---|
| 202Fh | 2C1Fh | 60C8h | 7330h | 7FB6h | AF3Ah | AF72h | B173h |
| Δ: | ⌊BF0⌋ | ⌊33A9⌋ | ⌊1268⌋ | ⌊C86⌋ | ⌊2F84⌋ | ⌊38⌋ | ⌊201⌋ |

Since there is no difference value less than or equal to fifteen, D$_i$ are subtracted from each data value, thus obtaining the following Table 7.

TABLE 7

| 0 | 1 | 2 | 3 | 4 | 5 | 6 | 7 |
|---|---|---|---|---|---|---|---|
| 202Fh | 2C10h | 609Ah | 72EBh | 7F56h | AEC5h | AEE2h | B06Eh |
| Δ: | ⌊BE1⌋ | ⌊338A⌋ | ⌊124F⌋ | ⌊C6B⌋ | ⌊2F6F⌋ | ⌊1D⌋ | ⌊18C⌋ |

As shown in Table 7, since not all of the difference values can be expressed with eleven bits, the state of each data value is converted by adding a predetermined number shown in Table 8 to each data value. Table 8 shows the values when state conversion flag CE is 001.

TABLE 8

| 0 | 1 | 2 | 3 | 4 | 5 | 6 | 7 |
|---|---|---|---|---|---|---|---|
| C694h | 3EC3h | F802h | 77B2h | 64F0h | 2187h | 0B42h | 028Dh |

The values of Table 7 are added to the corresponding values of Table 8, to obtain the following Table 9.

TABLE 9

| 0 | 1 | 2 | 3 | 4 | 5 | 6 | 7 |
|---|---|---|---|---|---|---|---|
| E6C3h | B1F3h | 58CAh | 2925h | 142Ah | 4DA6h | 8AF8h | B1FFh |

Barring any difficulty in restoring compressed data, the overflow generated in the adding process is negligible. Using Table 9, it is determined whether there is a difference value smaller than the threshold difference value (D) of the second step. Here, since the difference between the second and eighth data values is 1100 (Ch), the eighth data B1FFh is converted, using the CS, CT, CV, CE, CA$_2$, CA$_g$ and d values, into 01X, 001, 001, 111 and 1100.

Thus, when "0" is newly added to new save bit X, the converted data is expressed as 0100,0100,1111,1100 (44FCh). The converted data is positioned in a first position, and Table 9 is rearranged to obtain Table 10.

TABLE 10

| 0 | 1 | 2 | 3 | 4 | 5 | 6 | 7 |
|---|---|---|---|---|---|---|---|
| 44FCh | E6C3h | B1F3h | 58CAh | 2925h | 142Ah | 4DA6h | 8AF8h |

Therefore, 128-bit data is compressed by one bit into 127-bit data through data conversion, and 128 bits are newly formed by newly inputting one bit. If there is no difference value less than or equal to a threshold difference value (D) generated by state conversion, the first step is performed again.

EMBODIMENT 2

Assuming that CS is 1-bit start information, N is 511 (the number of bits of input information), k is 32 (the number of bits of divided data), m is 16 (the number of divisions), CT is T-bit compression step flag information (T is the number of bits of CT, e.g., 1), CV is 1-bit save information, CA$_i$ is a-bit data sequence information (a is the number of bits of $_1$CA, e.g., 4 and 0≦i<15), CE is e-bit state conversion information (e is the number of bits of CE, e.g., 4), and threshold difference value D is 131,071 (e.g., $2^{k-T-2-2a-e}-1=2^{32-1-2-(2\times 4)-4}-1=2^{17}-1$).

In the first step, a 512-bit stream obtained by combining start information (S) "1" and then a 511-bit information word (N) is divided into sixteen 32-bit data values. The result is shown in Table 11.

TABLE 11

| 0 | A62B4BF3 |
|---|---|
| 1 | 023427CB |
| 2 | 864BAD06 |
| 3 | 6391ABDF |
| 4 | 1F81003B |
| 5 | B72C227D |
| 6 | 46E7609D |

TABLE 11-continued

| | |
|---|---|
| 7 | 55640720 |
| 8 | C38E2EB5 |
| 9 | F3DF2208 |
| 10 | 943E2E28 |
| 11 | 237E283C |
| 12 | D80E3479 |
| 13 | EEB427CA |
| 14 | 372AAB11 |
| 15 | 720BFC21 |

In the second step, each difference value d between each two adjacent data values is obtained. It is then determined whether there is a difference value smaller than D. Since there is no difference value d smaller than D, the data is rearranged in an ascending series to obtain the following Table 12.

TABLE 12

| | |
|---|---|
| 0(1) | 023427CB |
| 1(4) | 1F81003B |
| 2(11) | 237E283C |
| 3(14) | 372AAB11 |
| 4(6) | 46E7609D |
| 5(7) | 55640720 |
| 6(3) | 6391ABDF |
| 7(15) | 720BFC21 |
| 8(2) | 864BAD06 |
| 9(10) | 943E2E28 |
| 10(0) | A62B4BF3 |
| 11(5) | B72C227D |
| 12(8) | C38E2EB5 |
| 13(12) | D80E3479 |
| 14(13) | EEB427CA |
| 15(9) | F3DF2208 |

Original position information (Table 11) is arranged in the order of the rearranged data (Table 12) and results in the sequence 0001-0100-1011-1110-0110-0111-0011-1111-0010-1010-0000-0101-1000-1100-1101-1001.

Since all difference values between each two adjacent data values are greater than or equal to 131,071, preset values $D_i$ (0<i<16) are subtracted from each data value to obtain Table 13.

TABLE 13

| | |
|---|---|
| 0(1) | 023427CB |
| 1(4) | 1F7F003C |
| 2(11) | 237A283A |
| 3(14) | 3724AB14 |
| 4(6) | 46DF60A1 |
| 5(7) | 555A0725 |
| 6(3) | 6385ABE5 |
| 7(15) | 71FDFC28 |
| 8(2) | 863BAD0E |
| 9(10) | 942C2E31 |
| 10(0) | A6174BFD |
| 11(5) | B7162288 |
| 12(8) | C3762E91 |
| 13(12) | D7F43486 |
| 14(13) | EE9827D8 |
| 15(9) | F3C12217 |

Original position information bit number (e.g., 64), start information bit number (e.g., 1), step information bit number (e.g., 1), save bit information bit number (e.g. 1), and state conversion information bit number (e.g., 4) are subtracted from 512 to leave 441 (r), and a quotient (q) obtained by dividing 441 (r) by 16 (m) is 27. In the case of 4-bit sub-step flag (f), if all difference values among data are 27 bits or less, b is obtained using the equation:

$$b = k + q(m-1) + f$$

(e.g., b=32+(27×15)+4) and equals 441. Since the number of reduced bits is a non-negative value, it is possible to amount to difference values as q bits. All difference values are not 27 bits or less however. When one difference value is 27 bits or more, b is 432 (e.g., 32+32+(26×14)+4). Since only one difference value is 27 bits or more however, and the remaining difference values are not less than or equal to 26 bits, state variables are added to data for re-examination. Table 14 shows state variables set in the case when a state variable flag is 0001.

TABLE 14

| | |
|---|---|
| 0 | 36AB274C |
| 1 | 68934ED1 |
| 2 | EB4A2758 |
| 3 | 6403019E |
| 4 | 4FC327B2 |
| 5 | B47248DC |
| 6 | 55486020 |
| 7 | 00632789 |
| 8 | 469537E9 |
| 9 | 8400AC9D |
| 10 | 42063C28 |
| 11 | C407203A |
| 12 | D6842730 |
| 13 | 02416101 |
| 14 | 3A6A7C71 |
| 15 | 05D24677 |

The values of Table 14 are added to the corresponding values of Table 13, to obtain the following Table 15.

TABLE 15

| | |
|---|---|
| 0(1) | DCD6733F |
| 1(4) | 6AC7769C |
| 2(11) | 7195D45E |
| 3(14) | C794AD7D |
| 4(6) | 6F4427ED |
| 5(7) | 6B9E6B59 |
| 6(3) | 9C2FC0BD |
| 7(15) | 55C72EA9 |
| 8(2) | 0A23669E |
| 9(10) | 77DFCEA5 |
| 10(0) | D6446A50 |
| 11(5) | E7854876 |
| 12(8) | AE925BA9 |
| 13(12) | F0F588CB |
| 14(13) | 71952782 |
| 15(9) | 77DE4298 |

Table 15 is used to determine whether there is a difference value smaller than a threshold difference value (D). Since the difference between the third and fifteenth data values is 44,252, the third data value 7195D45E is converted, using values of CS, CT, CV, CE, $CA_{15}$, $CA_3$ and d, into 01X 0001 1110 0010 01010110011011100. Thus, when "1" is newly added to a new save bit X, the converted data is expressed as 63C4ACDCh. The converted data is put in a first place, and Table 15 is rearranged to obtain the following Table 16.

TABLE 16

| | |
|---|---|
| 0(1) | 63C4ACDC |
| 1(4) | DCD6733F |
| 2(11) | 6AC7769C |
| 3(14) | C794AD7D |
| 4(6) | 6F4427ED |
| 5(7) | 6B9E6B59 |
| 6(3) | 9C2FC0BD |
| 7(15) | 55C72EA9 |

TABLE 16-continued

| | |
|---|---|
| 8(2) | 0A23669E |
| 9(10) | 77DFCEA5 |
| 10(0) | D6446A50 |
| 11(5) | E7854876 |
| 12(8) | AE925BA9 |
| 13(12) | F0F588CB |
| 14(13) | 71952782 |
| 15(9) | 77DE4298 |

Using Table 16, it is determined whether there is a difference value smaller than threshold difference value D. Since it is determined that the difference between the tenth and sixteenth data values is 101,389, the tenth data value is expressed as 45F38C0Dh together with save bit "0" in the same way as mentioned above using values CS (1), CT (1), CV (0), CE (0010), $CA_{16}$ (1111), $CA_{10}$ (1001) and d (11000110000001101). The converted data is put in a first place, and Table 16 is rearranged to obtain the following Table 17.

TABLE 17

| | |
|---|---|
| 0(1) | 45F38C0D |
| 1(4) | 63C6ACDC |
| 2(11) | DCD6733F |
| 3(14) | 6AC7769C |
| 4(6) | C794AD7D |
| 5(7) | 6F4427ED |
| 6(3) | 6B9E6B59 |
| 7(15) | 9C2FC0BD |
| 8(2) | 55C72EA9 |
| 9(10) | 0A23669E |
| 10(0) | D6446A50 |
| 11(5) | E7854876 |
| 12(8) | AE925BA9 |
| 13(12) | F0F588CB |
| 14(13) | 71952782 |
| 15(9) | 77DE4298 |

If a difference value less than or equal to a threshold difference value (D) is not generated by state conversion, all possible state conversions are sequentially performed. If there is still no difference value less than or equal to D, the first step is performed again.

A data expansion method according to the present invention is attained by reversely performing the aforementioned data compression method by (a) obtaining an (N–X)-bit information word from an N-bit information word; (b) expanding the remaining X-bit information word into an N-bit information word, excluding the (N–X)-bit information word; and (c) repeatedly performing the steps (a) and (b).

As described above, according to a compression and expansion method of a bit stream of the present invention, bit information having a predetermined length is divided into a plurality of data values and is expressed by difference values between each two adjacent data values, thereby allowing lossless data compression. Data restoration is accomplished by adding each difference value to an initial value at the time of expansion.

What is claimed is:

1. A data compression method for compressing and storing data contained within a bit stream, the method comprising the steps of:

obtaining an initial N-bit information word from a bit stream of an electrical signal, where N is a positive integer;

compressing said initial N-bit information word into an X-bit information word where X is less than N and where X is a positive integer;

obtaining an (N–X)-bit information word from said bit stream;

producing a new N-bit information word using said compressed X-bit information word and said (N–X)-bit information word; and repeatedly performing steps of said compressing said N-bit information word, obtaining said (N–X)-bit information word, and producing said new N-bit information word when said new N-bit information word is compressible, and otherwise generating compressed data by repeatedly performing steps of said obtaining said initial N-bit information word, compressing said N-bit information word, obtaining said (N–X)-bit information word, producing said new N-bit information word, and writing said compressed data in a storage medium.

2. A data compression method according to claim 1, wherein said step of compressing said initial N-bit information word comprised substeps of:

(b1) dividing N+1 bits including said initial N-bit information word and 1-bit start information into m data words, m being an integer greater than one, of k bits, where k is a positive integer;

(b2) determining whether there is a difference value smaller than a preset threshold value D among m–1 difference values of m data words and if present, converting one of two data values, whose difference is smaller than said preset threshold value D, into a k-bit information word including 1-bit start information, T-bit flag compression step information, e-bit state conversion information, 1-bit new information, a-bit sequence information of the two data values, and (k–T–2–2a–e)-bit difference value information where D, m, T, e, and a are positive integers;

(b3) inputting 1-bit of new information and repeatedly performing step (b2) until there is no difference value smaller than D among m–1 difference values of m data words with respect to m data words processed in step (b2); and (b4) repeatedly performing steps (b1) through (b3) if a difference value smaller than D is no longer present among (m–1) difference values of m data words, where $k \geq (2a+T+e+2)$ and $D=2^{k-T-2-2a-e}-1$.

3. A data compression method according to claim 1, further comprised of compressing said initial N-bit information word into said X-bit information word where X is less than N and where X is a positive integer, by:

making a reduction in said initial N-bit information word by:

dividing N+1 bits including said initial N-bit information word and 1-bit start information into m data words, m being an integer greater than one, of k bits, where k is a positive integer;

whenever there is a difference value smaller than a preset threshold value D among m–1 difference values of m data words, making a conversion of one of two data values having a difference smaller than said preset threshold value D, into a k-bit information word including 1-bit start information, T-bit flag compression step information, e-bit state conversion information, 1-bit new information, a-bit sequence information of the two data values, and (k–T31 2–2a–e)-bit difference value information where D, m, T, e, and a are positive integers;

inputting 1-bit of new information and repeatedly making said conversion until there is no difference value smaller than D among (m−1) difference values of m data words with respect to m data words processed during said conversion; and repeatedly performing steps of making said reduction whenever a difference value smaller than D is no longer present among (m−1) difference values of m data words, where $k \geq (2a+T+e+2)$ and $D=2^{k-T-2-2a-e}-1$.

4. A data compression method of claim 2, wherein said converted data is placed in a first position of one of the m data words.

5. A data compression method of claim 3, further comprised of placing said converted data into a first position of one of the m data words.

6. A data compression method for compressing and storing data contained within a bit stream, the method comprising the steps of:

(a) obtaining an (N−1)-bit information word from the bit stream of an electronic signal and dividing N bits composed of the (N−1)-bit information word and 1-bit start information into m data words of k bits, where N and k are positive integers;

(b) determining whether there is a difference value smaller than a preset threshold value D among m−1 difference values of m data words, and if so, converting one of two data value into a k-bit information word including 1-bit start information, T-bit flag compression step information, e-bit state conversion information, 1-bit new information, a-bit sequence information of two data values, and (k−T−2−2a−e)-bit difference value information where D, m, T, e and a are positive integers;

(c) inputting 1-bit information and repeatedly performing step (b) until there is no difference value smaller than D among m−1 difference values of m data words processed in step (b);

(d) rearranging m data words according to magnitudes of difference values if there is no difference value smaller than D among m−1 difference values of said m data words, and sequentially storing original sequence information of said rearranged m data words in the order of said rearranged data;

(e) subtracting preset values $D_i$ from the remaining data except for a first rearranged data rearranged in step (d), where $1 \leq i \leq m-1$;

(f) obtaining the remaining number of bits r obtained by subtracting start information bit number, m·a, compression step information bit number, new information bit number, and state conversion information bit number from N, obtaining a quotient q by dividing r by m, and determining whether r is smaller than b=k+q(m−1)+f, where f is the number of compression step flag bits;

(g) converting the N bits into start information, compression step information, new information, state conversion information, sequence information, sub-step information, first sorted data, [q(m−1)]-bit difference values of subtraction-operated data equal to q bits or less, and the remaining bits of the N bits, if r is greater than or equal to b and difference values are q bits or less, and alternatively converting the N bits into start information, compression step information, new information, state conversion information, sequence information, sub-step information, first sorted data, [k+(logm/log2)]-bit display information of one of said subtraction-operated data equal to q bits or more, [(q−1)(m−2)]-bit difference values of remaining subtraction-operated data equal to q−1 bits or less, and the remaining bits of the N bits, if r is greater than or equal to b, only one difference value is q bits or more and the remaining bits amount to q−1 bits or less;

(h) converting the N bits into start information, compression step information, new information, state conversion information, sequence information, sub-step information, a first sorted data, [(q−1)(m−1)]-bit difference values of subtraction-operated data equal to q−1 bits or less, and remaining bits among N bits, if r is less than b, q is set to (q−1) and all difference values are (q−1) bits or less, and alternatively converting the N bits into start information, compression step information, new information, state conversion information, sequence information, sub-step information, first sorted data, [k+(logm/log2)]-bit display information of one of subtraction-operated data equal to (q−1) bits or more, [(q−2)×(m−2)]-bit difference values of the remaining subtraction-operated data equal to (q−2) bits or less, and remaining bits among N bits, if r is less than b, one difference value is (q−1) bits or more and the remaining difference values amount to (q −2) bits or less;

(i) repeatedly performing steps (b) through (h) with respect to the N-bit word stream processed through steps (g) and (h);

(j) terminating compression if none of the conditions of steps (b) through (h) are satisfied, and repeatedly performing steps (a) through (i), where $k \geq 2a+T+e+2$ and k is a positive integer where r exists, $D=2^{k-T-2-2a-e}-1$, and N=km, m being an integer greater than one and storing the compressed data.

7. A data compression method for compressing and storing data contained within a bitstream, the method comprising the steps of:

(a) obtaining an (N−1)-bit information word from the bit stream of an electronic signal and dividing N bits composed of an (N−1)-bit information and 1-bit start information into m data words of k bits, where N and a are positive integers;

(b) determining whether there is a difference value smaller than a preset threshold value D among m−1 difference values of m data words, and if so, converting one of two data values into a k-bit information including 1-bit start information word, T-bit flag compression step information, e-bit state conversion information, 1-bit new information, a-bit sequence information of said two data values, and (k−T−2−2a−e)-bit difference value information, where D, M, T, e, and a are positive integers;

(c) inputting 1-bit of new information and repeatedly performing said step (b) until there is no difference value smaller than D among m−1 difference values of m data words processed in step (b);

(d) rearranging m data word according to magnitudes of difference values if there is no difference value smaller than D among m−1 difference values of said m data word, and sequentially storing original sequence information of said rearranged m data words in the order of the rearranged data;

(e) subtracting preset values $D_i$ from the remaining data values except for a first data value rearranged in step (d), where $1 \leq i \leq m-1$;

(f) obtaining the remaining number of bits r obtained by subtracting start information bit number, m·a, compression step information bit number, new information bit number, and state conversion information bit number from N, obtaining a quotient q by dividing r by m, and checking whether or not r is smaller than b=k+q(m−1)+f, where f is the number of compression step flag bits;

(g) converting the N bits into start information, compression step information, new information, state conversion information, sequence information, sub-step information, first sorted data, [q(m−1)]-bit difference values of subtraction-operated data equal to q bits or less, and the remaining bits of the N bits, if r is greater than or equal to b and all difference values are to q bits or less, and alternatively converting the N bits into start information, compression step information, new information, state conversion information, sequence information, sub-step information, first sorted data, [k+(logm/log2)]-bit display information of one kind of the subtraction-operated data equal to q bits or more, [(q−1)(m−2)]-bit difference values of remaining subtraction-operated data equal to q−1 bits or less, and the remaining bits of the N bits, if r is greater than or equal to b, only one difference value is q bits or more and the remaining bits are q−1 bits or less;

(h) converting the N bits into start information, compression step information, new information, state conversion information, sequence information, sub-step information, a first sorted data, [(q−1)(m−1)]-bit difference values of subtraction-operated data equal to q−1 bits or less, and remaining bits among N bits, if r is less than b, q is set to q−1 and all difference values are q−1 bits or less, and alternatively converting the N bits into start information, compression step information, new information, state conversion information, sequence information, sub-step information, first sorted data, [k+(logm/log2)]-bit display information of one of subtraction-operated data equal to q−1 bits or more, [(q−2)(m−2)]-bit difference values of the remaining subtraction-operated data equal to q−2 bits or less, and remaining bits among N bits, if r is less than b, one difference value is q−1 bits or more and the remaining difference values are q−2 bits or less;

(i) changing data values using an operation with preset values if the conditions of any of steps (g) and (h) fails to be met;

(j) searching for the case satisfying conditions of steps (b) through (h) with respect to changed data and compressing data according to state conversion information for all preceding steps; and (k) terminating compression if none of conditions of steps (b) through (j) are satisfied, and repeatedly performing steps (a) through (j), where $k \geq 2a+T+e+2$ and k is a positive integer where r exists, $D=2^{k-T-2-2a-e}-1$, and N=km, m being an integer greater than one and storing the compressed data.

8. A data compression method as claimed in claim 7, wherein the operation in step (i) is one of summation, subtraction, and exclusive-ORing.

9. An apparatus for compressing and storing data contained within a bitstream, the apparatus comprising:

a receiving means for receiving an electronic signal and for extracting a bitstream therefrom;

a first obtaining means for obtaining an N-bit information word from said extracted bit stream, where N is a positive integer;

a compression means for compressing the N-bit information word into an X-bit information word where X is less than N and where X is a positive integer;

a second obtaining means for obtaining an (N−X)-bit information word from said extracted bit stream;

a producing means for producing a new N-bit information word using said compressed X-bit information word and said (N−X)-bit information word; and a control and storage means for causing said compression means through said producing means to repeatedly perform if the new N-bit information word is compressible and for otherwise causing said obtaining means through said producing means to repeatedly perform and for storing the compressed data.

10. An apparatus according to claim 9, wherein said compression means comprises:

a dividing means for dividing N+1 bits including the N-bit information word and 1-bit start information into m data words, m being an integer greater than one, of k bits, where k is a positive integer;

a difference determining means for determining whether there is a difference value smaller than a preset threshold value D among m−1 difference values of m data words and if present, converting one of two data values, whose difference is smaller than said preset threshold value D, into a k-bit information word including 1-bit start information, T-bit flag compression step information, e-bit state conversion information, 1-bit new information, a-bit sequence information of the two data values, and (k−T−2−2a−e)-bit difference value information where D, m, T, e, and a are positive integers;

an inputting means for inputting 1-bit of new information and for causing said difference determining means to repeatedly perform until there is no difference value smaller than D among m−1 difference values of m data words with respect to m data words processed by said seventh means; and a control means for causing said dividing means through said inputting means to repeatedly perform if a difference value smaller than D is no longer present among m−1 difference values of m data words, where $k \geq 2a+T+e+2$ and $D=2^{k-T-2-2a-e}-1$.

11. An apparatus for compressing and storing data contained within a bit stream, the apparatus comprising:

a receiving means for receiving an electronic signal and for extracting a bit stream therefrom;

a first obtaining means for obtaining an (N−1)-bit information word from said extracted bit stream and for dividing N bits composed of the (N−1)-bit information word and 1-bit start information into m data words of k bits, where N and k are positive integers;

a first difference determining means for determining whether there is a difference value smaller than a preset threshold value D among m−1 difference values of m data words, and if so, converting one of two data value into a k-bit information word including 1-bit start information, T-bit flag compression step information, e-bit state conversion information, 1-bit new information, a-bit sequence information of two data values, and (k−T−2−2a−e)-bit difference value information where D, m, T, e and a are positive integers;

an inputting means for inputting 1-bit information and for causing said obtaining means to repeatedly perform until there is no difference value smaller than D among m−1 difference values of m data words processed by said difference determining means;

a rearranging means for rearranging m data words according to magnitudes of difference values if there is no difference value smaller than D among m−1 difference values of said m data words, and for sequentially storing original sequence information of said rearranged m data words in the order of said rearranged data;

a subtracting means for subtracting preset values $D_i$ from the remaining data except for a first rearranged data rearranged by said rearranging means, where $1 \leq I \leq m-1$;

a second obtaining means for obtaining the remaining number of bits r obtained by subtracting start information bit number, m·a, compression step information bit number, new information bit number, and state conversion information bit number from N, obtaining a quotient q by dividing r by m, and determining whether r is smaller than b=k+q(m−1)+f, where f is the number of compression step flag bits;

a second difference determining means for converting the N bits into start information, compression step information, new information, state conversion information, sequence information, sub-step information, first sorted data, [q(m−1)]-bit difference values of subtraction-operated data equal to q bits or less, and the remaining bits of the N bits, if r is greater than or equal to b and difference values are q bits or less, and for alternatively converting the N bits into start information, compression step information, new information, state conversion information, sequence information, sub-step information, first sorted data, [k+(logm/log2)]-bit display information of one of said subtraction-operated data equal to q bits or more, [(q−1)(m−2)]-bit difference values of remaining subtraction-operated data equal to q−1 bits or less, and the remaining bits of the N bits, if r is greater than or equal to b, only one difference value is q bits or more and the remaining bits amount to q−1 bits or less;

a third difference determining means for converting the N bits into start information, compression step information, new information, state conversion information, sequence information, sub-step information, a first sorted data, [(q−1)(m−1)]-bit difference values of subtraction-operated data equal to q−1 bits or less, and remaining bits among N bits, if r is less than b, q is set to q−1 and all difference values are q−1 bits or less, and for alternatively converting the N bits into start information, compression step information, new information, state conversion information, sequence information, sub-step information, first sorted data, [k+(logm/log2)]-bit display information of one of subtraction-operated data equal to q−1 bits or more, [(q−2)×(m−2)]-bit difference values of the remaining subtraction-operated data equal to q−2 bits or less, and remaining bits among N bits, if r is less than b, one difference value is q−1 bits or more and the remaining difference values amount to q−2 bits or less;

a first control means for causing said first difference determining means through said third difference determining means to repeatedly perform with respect to the N-bit word stream processed by said second and third difference determining means;

a control and storage means for terminating compression if none of the conditions effected by said first through third difference determining means are satisfied, and for causing said first difference determining means through first control means to repeatedly perform, where $k \geq 2a+T+e+2$ and k is a positive integer where r exists, $D=2^{k-T-2-2a-e}-1$, and N=km, m being an integer greater than one and for storing the compressed data.

12. An apparatus for compressing and storing data contained within a bitstream, the apparatus comprising:

a receiving means for receiving an electronic signal and for extracting a bit stream therefrom;

a first obtaining means for obtaining an (N−1)-bit information word from said extracted bit stream and for dividing N bits composed of an (N−1)-bit information and 1-bit start information into m data words of k bits, where N and a are positive integers;

a first difference determining means for determining whether there is a difference value smaller than a preset threshold value D among m−1 difference values of m data words, and if so, converting one of two data values into a k-bit information including 1-bit start information word, T-bit flag compression step information, e-bit state conversion information, 1-bit new information, a-bit sequence information of said two data values, and (k−T−2−2a−e)-bit difference value information, where D, M, T, e, and a are positive integers;

an inputting means for inputting 1-bit of new information and for causing said first difference determining means to repeatedly performing said step (b) until there is no difference value smaller than D among m−1 difference values of m data words processed by said first difference determining means;

a rearranging means for rearranging m data word according to magnitudes of difference values if there is no difference value smaller than D among m−1 difference values of said m data word, and for sequentially storing original sequence information of said rearranged m data words in the order of the rearranged data;

a subtracting means for subtracting preset values $D_i$ from the remaining data values except for a first data value rearranged by said rearranging means, where $1 \leq i \leq m-1$;

a second obtaining means for obtaining the remaining number of bits r obtained by subtracting start information bit number, m·a, compression step information bit number, new information bit number, and state conversion information bit number from N, obtaining a quotient q by dividing r by m, and checking whether or not r is smaller than b=k+q(m−1)+f, where f is the number of compression step flag bits;

a second difference determining means for converting the N bits into start information, compression step information, new information, state conversion information, sequence information, sub-step information, first sorted data, [q(m−1)]-bit difference values of subtraction-operated data equal to q bits or less, and the remaining bits of the N bits, if r is greater than or equal to b and all difference values are to q bits or less, and for alternatively converting the N bits into start information, compression step information, new information, state conversion information, sequence information, sub-step information, first sorted data, [k+(logm/log2)]-bit display information of one kind of the subtraction-operated data equal to q bits or more, [(q−1)(m−2)]-bit difference values of remaining subtraction-operated data equal to q−1 bits or less, and the remaining bits of the N bits, if r is greater than or equal to b, only one difference value is q bits or more and the remaining bits are q−1 bits or less;

a third difference determining means for converting the N bits into start information, compression step information, new information, state conversion information, sequence information, sub-step information, a first sorted data, [(q−1)(m−1)]-bit difference values of subtraction-operated data equal to q−1 bits or less, and remaining bits among N bits, if r is less than b, q is set to q−1 and all difference values are q−1 bits or less, and for alternatively converting the N bits into start information, compression step information, new information, state conversion information, sequence information, sub-step information, first sorted data, [k+(logm/log2)]-bit display information of one of subtraction-operated data equal to q−1 bits or more, [(q−2)(m−2)]-bit difference values of the remaining subtraction-operated data equal to q−2 bits or less, and remaining bits among N bits, if r is less than b, one difference value is q−1 bits or more and the remaining difference values are q−2 bits or less;

a changing means for changing data values using an operation with preset values if the conditions of any of said second or third difference determining means fails to be met;

a first control means for searching for the case satisfying conditions of said first through third difference determining means with respect to changed data and for compressing data according to state conversion information for all of said first obtaining means through third difference determining means; and a control and storage means for terminating compression if none of conditions of said first difference determining means through said first control means are satisfied, and for causing said first obtaining means through said first control means to repeatedly perform, where $k \geq 2a+T+e+2$ and k is a positive integer where r exists, $D=2^{k-T-2-2a-e}-1$, and $N=km$, m being an integer greater than one and for storing the compressed data.

13. An apparatus as claimed in claim 12, wherein the operation effected by said changing means is one of summation, subtraction, and exclusive-ORing.

14. A data compression and expansion method for compressing and storing data contained within a bit stream and for restoring previously compressed and stored data from the bitstream, the data compression method comprising the steps of:

obtaining an initial N-bit information word from a bit stream of an electrical signal, where N is a positive integer;

compressing said initial N-bit information word into an X-bit information word where X is less than N and where X is a positive integer;

obtaining an (N−X)-bit information word from said bit stream;

producing a new N-bit information word using said compressed X-bit information word and said (N−X)-bit information word; and repeatedly performing steps of said compressing said N-bit information word, obtaining said (N−X)-bit information word, and producing said new N-bit information word when said new N-bit information word is compressible, and otherwise generating compressed data by repeatedly performing steps of said obtaining said initial N-bit information word, compressing said N-bit information word, obtaining said (N−X)-bit information word, producing said new N-bit information word, and writing said compressed data in a storage medium; and the data expansion method comprising the steps of:

(a) obtaining an (N−X)-bit information word from a stored N-bit information word obtained from the bitstream of an electronic signal and stored in the memory;

(b) expanding a remaining X-bit information word into an N-bit information word, excluding (N−X)-bit information; and (c) repeatedly performing steps (a) and (b) until an N-bit information word is restored and storing end outputting the restored bitstream.

15. The data compression and expansion method according to claim 14, wherein said step of compressing said initial N-bit information word comprises substeps of:

(b1) dividing N+1 bits including said initial N-bit information word and 1-bit start information into m data words, m being an integer greater than one, of k bits, where k is a positive integer;

(b2) determining whether there is a difference value smaller than a preset threshold value D among m−1 difference values of m data words and if present, converting one of two data values, whose difference is smaller than said preset threshold value D, into a k-bit information word including 1-bit start information, T-bit flag compression step information, e-bit state conversion information, 1-bit new information, a-bit sequence information of the two data values, and (k−T−2−2a−e)-bit difference value information where D, m, T, e, and a are positive integers;

(b3) inputting 1-bit of new information and repeatedly performing step (b2) until there is no difference value smaller than D among m−1 difference values of m data words with respect to m data words processed in step (b2); and (b4) repeatedly performing steps (b1) through (b3) if a difference value smaller than D is no longer present among (m−1) difference values of m data words, where $k \geq (2a+T+e+2)$ and $D=2^{k-t-2-2a-e}-1$.

16. The data compression and expansion method according to claim 14, further comprised of compressing said initial N-bit information word into said X-bit information word where X is less than N and where X is a positive integer, by:

making a reduction in said initial N-bit information word by:

dividing N+1 bits including said initial N-bit information word and 1-bit start information into m data words, m being an integer greater than one, of k bits, where k is a positive integer;

whenever there is a difference value smaller than a preset threshold value D among m−1 difference values of m data words, making a conversion of one of two data values having a difference smaller than said preset threshold value D, into a k-bit information word including 1-bit start information, T-bit flag compression step information, e-bit state conversion information, 1-bit new information, a-bit sequence information of the two data values, and (k−T−2−2a−e)-bit difference value information where D, m, T, e, and a are positive integers;

inputting 1-bit of new information and repeatedly making said conversion until there is no difference value smaller than D among (m−1) difference values of m data words with respect to m data words processed during said conversion; and repeatedly performing steps of making said reduction whenever a difference value smaller than D is no longer present among (m−1) difference values of m data words, where k≧(2a+T+e+2) and D=$2^{k-T-2-2a-e}-1$.

17. The data compression and expansion method of claim 15, wherein said converted data is placed in a first position of one of the m data words.

18. The data compression and expansion method of claim 16, further comprised of placing said converted data into a first position of one of the m data words.

19. An apparatus for compressing and storing data contained within a bitstream and for restoring previously compressed and stored data from the bitstream, the apparatus comprising:

a receiving means for receiving an electronic signal and for extracting a bitstream therefrom;

a first obtaining means for obtaining an N-bit information word from said extracted bit stream, where N is a positive integer;

a compression means for compressing the N-bit information word into an X-bit information word where X is less than N and where X is a positive integer;

a second obtaining means for obtaining an (N−X)-bit information word from said extracted bit stream;

a producing means for producing a new N-bit information word using said compressed X-bit information word and said (N−X)-bit information word, a control and storage means for causing said compression means through said producing means to repeatedly perform if the new N-bit information word is compressible and for otherwise causing said obtaining means through said producing means to repeatedly perform and for storing the compressed data;

a memory for storing previously compressed data extracted from the bit stream of an electronic signal;

an obtaining means for obtaining an (N−X)-bit information word from a stored N-bit information word from the bitstream stored in the memory;

an expanding means for expanding a remaining X-bit information word into an N-bit information word, excluding (N−X)-bit information;

a control means for causing said obtaining means and said expanding means to repeatedly perform until an N-bit information word is restored and for storing it in said memory; and an output means for outputting the restored bitstream stored in said memory.

20. The apparatus according to claim 19, wherein said compression means comprises:

a dividing means for dividing N+1 bits including the N-bit information word and 1-bit start information into m data words, m being an integer greater than one, of k bits, where k is a positive integer;

a difference determining means for determining whether there is a difference value smaller than a preset threshold value D among m−1 difference values of m data words and if present, converting one of two data values, whose difference is smaller than said preset threshold value D, into a k-bit information word including 1-bit start information, T-bit flag compression step information, e-bit state conversion information, 1-bit new information, a-bit sequence information of the two data values, and (k−T−2−2a−e)-bit difference value information where D, m, T, e, and a are positive integers;

an inputting means for inputting 1-bit of new information and for causing said difference determining means to repeatedly perform until there is no difference value smaller than D among m−1 difference values of m data words with respect to m data words processed by said seventh means; and a control means for causing said dividing means through said inputting means to repeatedly perform if a difference value smaller than D is no longer present among m−1 difference values of m data words, where k≧2a+T+e+2 and D=$2^{k-T-2-2a-e}-1$.

* * * * *